US008041950B2

(12) United States Patent
Marinet et al.

(10) Patent No.: US 8,041,950 B2
(45) Date of Patent: Oct. 18, 2011

(54) RANDOM SIGNAL GENERATOR

(75) Inventors: Fabrice Marinet, Chateauneuf le Rouge (FR); Alexandre Malherbe, Trets (FR)

(73) Assignee: STMicroelectronics S.A., Montrouge (FR)

( * ) Notice: Subject to any disclaimer, the term of this patent is extended or adjusted under 35 U.S.C. 154(b) by 70 days.

(21) Appl. No.: 12/731,808

(22) Filed: Mar. 25, 2010

(65) Prior Publication Data

US 2010/0180117 A1    Jul. 15, 2010

Related U.S. Application Data

(62) Division of application No. 09/995,258, filed on Nov. 27, 2001, now Pat. No. 7,706,529.

(30) Foreign Application Priority Data

Nov. 28, 2000  (FR) ..................................... 00 15309

(51) Int. Cl.
*H04L 9/00* (2006.01)
*H01L 27/088* (2006.01)
*G06F 21/00* (2006.01)

(52) U.S. Cl. ........... 713/168; 713/189; 380/44; 257/401

(58) Field of Classification Search ........................ None
See application file for complete search history.

(56) References Cited

U.S. PATENT DOCUMENTS

| | | | |
|---|---|---|---|
| 4,123,771 A | 10/1978 | Uchida | 257/324 |
| 4,862,237 A | 8/1989 | Morozumi | 257/72 |
| 4,905,176 A | 2/1990 | Schulz | 708/252 |
| 5,856,688 A | 1/1999 | Lee et al. | 257/295 |
| 5,961,577 A | 10/1999 | Soenen et al. | 708/251 |
| 6,209,123 B1 * | 3/2001 | Maziasz et al. | 716/123 |
| 6,324,558 B1 | 11/2001 | Wilber | 708/255 |
| 6,756,633 B2 | 6/2004 | Wang et al. | 257/317 |
| 6,818,936 B2 | 11/2004 | Lin et al. | 257/300 |
| 6,882,572 B2 | 4/2005 | Wang et al. | 365/185.18 |
| 6,906,389 B2 * | 6/2005 | Depetro et al. | 257/401 |
| 7,692,188 B2 * | 4/2010 | Cho et al. | 257/40 |
| 7,706,529 B2 * | 4/2010 | Marinet et al. | 380/44 |
| 7,922,084 B2 * | 4/2011 | Ishibashi et al. | 235/382 |
| 2004/0080356 A1 * | 4/2004 | Hareland et al. | 327/401 |
| 2004/0214396 A1 | 10/2004 | Wang et al. | 438/266 |

(Continued)

FOREIGN PATENT DOCUMENTS

EP    1209808 A1 *  5/2002

OTHER PUBLICATIONS

Gerosa et ai, nA Fully Integrated Chaotic System for the Generation of Truly Random Numbers, Jul. 2002, IEEE Transactions on Circuits and Systems-I: Fundamental Theory and Applications, vol. 49, No. 7, p. 993-1000.

(Continued)

*Primary Examiner* — Christopher Revak
(74) *Attorney, Agent, or Firm* — Lisa K. Jorgenson; Allen, Dyer, Doppelt, Milbrath & Gilchrist, P.A.

(57) ABSTRACT

A random signal generator uses a folded MOS transistor, whose drain-source current includes a random component, as an electronic noise source. The random signal generator generates a random binary signal from the random component. The invention may be applied, in particular, to smart cards.

24 Claims, 3 Drawing Sheets

U.S. PATENT DOCUMENTS

2006/0108650 A1* 5/2006 Cho et al. .................. 257/401

OTHER PUBLICATIONS

Patent Abstracts of Japan vol. 007, No. 076 (E-167). Mar. 30, 1983 & CR JP 58005006 A (Nippon Denki KK), Jan. 12, 1983.

Rodriguez-Vazquez A et al.: "CMOS Design of Chaotic Oscillators Using CR State Variables: A Monolithic Chua's Circuit" IEEE Transactions on Circuits and Systems II: Analog and Digital Signal Processing, IEEE Inc. New York, US, vol. 40. No. 10, Oct. 1, 1993, pp. 96-613.

* cited by examiner ary signal generator for smart cards.
RANDOM SIGNAL GENERATOR This application is a divisional of Ser. No. 09/995,258 filed Nov. 27, 2001, which is now U.S. Pat. No. 7,706,529, the entire disclosure of which is hereby incorporated herein by reference.

FIELD OF THE INVENTION

The present invention relates to random signal generators, and more particularly, though not exclusively, to a random binary signal generator for smart cards.

BACKGROUND OF THE INVENTION

A random binary signal generator allows a smart card, for example, during a terminal authentication procedure, to send a random binary sequence comprising 16 or 32 bits, for example. The card and terminal apply a secret key authentication function to the sequence. Thereafter, the terminal transmits the obtained result to the card, and the card compares its computed result with the one received from the terminal. If both results match, the terminal is presumed to be authentic and the card accepts the requested transaction.

Random generators are known in the art, and are implemented as state machines having a finite number of internal states. Such state machines comprise, for example, shift registers of which certain bits are fed-back through an XOR gate as an input to the machine. Starting from an initial internal state, the state machine is enabled by a clock signal, and a random bit is extracted from the state machine at each clock pulse.

A drawback of such state machines, however, is that they generate deterministic binary sequences that are highly repetitive, as well as an output statistical bias influencing the distribution of logic ones and logic zeros. To overcome this drawback, there is a need for state machines having a large number of internal states (ideally, the machine would have an infinite number of internal states), but this approach opposes the greater simplicity, lower cost and lower consumption desired for random signal generators.

A random signal generator can also be implemented by an electronic noise generator, such as the noise generated by an avalanche-connected diode or a biased diode, or also the thermal noise in a resistor. However, these noise sources are of very small amplitude. It is necessary to use a high gain amplifier with at least a 60 dB gain. This implies using power-consuming bipolar transistors. However, the presence of such transistors is undesired in many integrated circuits, in particular, integrated circuits used in smart cards.

SUMMARY OF THE INVENTION

In view of the foregoing background, an object of the present invention is therefore to provide a random signal generator that does not have the drawbacks of known generators.

This and other objects, advantages and features in accordance with the present invention are based on the observation that folded MOS transistors, such as having a zigzag-shaped channel, are known to be unusable when the technology employed is pushed to its limits. Folded MOS transistors are unusable in these situations because the drain-source current has an increasingly strong random component when the size of the zigzag-shaped channel decreases. A concept of the present invention is to take advantage of this drawback to provide a random signal generator that can be integrated within an integrated circuit, particularly, an integrated circuit for smart cards.

Thus, the present invention includes a random signal generator using an electronic noise source. The electronic noise source may comprise a folded MOS transistor whose drain-source current has a random component. The random signal generator also comprises means or a circuit for generating a random binary or digital signal from the random component.

According to one embodiment, the folded MOS transistor comprises an S-shaped or zigzag-shaped channel, in which the sizes are at the resolution limit allowed by the transistor manufacturing technology. According to another embodiment, the generator further comprises a reference transistor. The reference transistor receives a gate voltage and a bias current that are the same as those applied to the folded transistor for extracting the random component.

According to yet another embodiment, the generator comprises means or a circuit for comparing the random component to a detection current. The generator may comprise means or a circuit for amplifying the random component, and the generator may comprise means for sampling the random binary signal to obtain a random digital signal.

According to another embodiment, the generator comprises a logic circuit for generating random binary numbers from the random digital signal. The generator may automatically maintain the gate voltage of the folded transistor within a determined range of values that ensures delivery of an equally probable output signal.

According to another embodiment, the generator comprises a plurality of electronic noise sources generating a current that includes a random component. Each source is coupled to means or a circuit for generating a random binary signal from the random component generated by the source, respectively. The generator additionally may comprise means for combining the random binary signals from the sources to generate random binary signals.

The present invention also relates to an integrated circuit comprising a random binary signal generator according to the invention, and means or a circuit for connecting the generator output to other components in the integrated circuit. According to one embodiment, the integrated circuit is arranged on a support for forming a smart card or any other equivalent portable electronic item.

According to another embodiment, the integrated circuit comprises a processor unit including means or a circuit for receiving a random number generated by the generator, means or a circuit for transmitting the random number to an external terminal, means or a circuit for subjecting the random number to a secret key authentication function. The integrated circuit may further comprise means or a circuit for comparing the result of the function to a result provided by the terminal in response to the transmission of the random number, and means or a circuit for allowing a transaction with the terminal if the result provided by the terminal matches the result computed by the processor unit.

The present invention also relates to a method for generating a random number using an electronic noise source. The method comprises providing a folded transistor having an S-shaped or zigzag-shaped channel with sizes chosen to be at the resolution limit allowed by the transistor manufacturing technology, and extracting a random current component at the terminals of the folded MOS transistor. The method further comprises generating a binary or digital signal as a function of the random component, and sampling the binary signal.

According to one embodiment, the method further comprises amplifying the random component and subtracting therefrom a reference value before converting the random component into a binary signal. The method may also comprise the step of adjusting the gate voltage of the folded transistor as a function of the random binary signal obtained in the sampling step. The method may further comprise generating binary numbers from the binary signal.

BRIEF DESCRIPTION OF THE DRAWINGS

These and other objects, features and advantages of the invention will become clear from the following description of a generator according to the invention given by way of a non-limiting example, with reference to the enclosed drawings, in which:

FIG. 3a is a detailed view of transistor $M_c$ used as the noise source in the generator shown in FIG. 1;

FIG. 3b is a detailed view of the component shown in FIG. 3a;

DETAILED DESCRIPTION OF THE PREFERRED EMBODIMENTS

Figure 1:
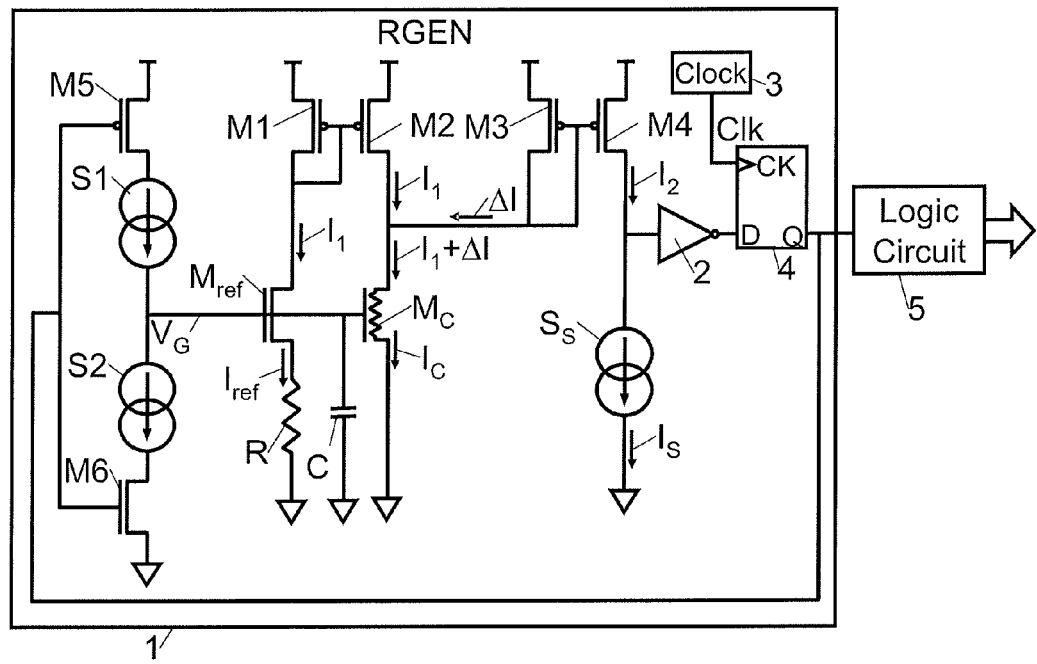
FIG. 1 is a schematic circuit diagram of a random number generator according to the invention.

FIG. 1 illustrates a binary random signal generator 1 according to the present invention. The generator comprises a transistor $M_c$ serving as an electronic noise source, as well as a reference transistor $M_{ref}$. According to the present invention, transistor $M_c$ is a folded MOS-type transistor having a drain-source current that randomly varies within a predetermined range of values for a given gate voltage. Reference transistor $M_{ref}$ includes characteristics similar to the characteristics of transistor $M_c$, but without any random component.

The generator 1 comprises two transistors M1, M2 arranged as a current mirror, which bias both transistors $M_{ref}$ and $M_c$ by applying the same current $I_1$ to the drain of transistors M1, M2. The source of transistor $M_c$ is grounded through a balancing resistor R formed by the drain-source resistance of transistor $M_c$. Because the drain-source current in transistor $M_c$ includes a random component, the drain current is $I_1+\Delta I$.

Figure 4:
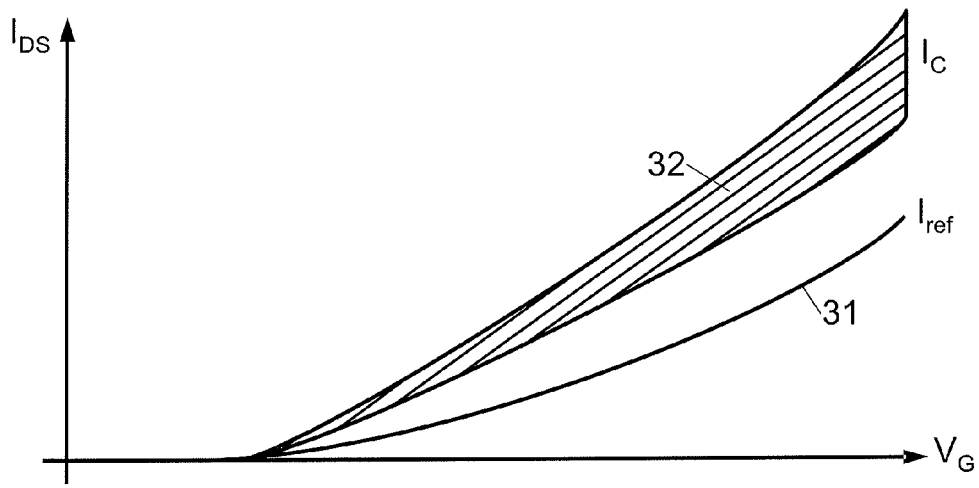
FIG. 4 is a plot of curves of the current variation in the reference component and the noise source component as a function of the voltage applied to the components according to the invention.

FIG. 4 shows the variation curves 31, 32 of drain-source currents $I_{ref}$ and $I_c$ in transistors $M_{ref}$ and $M_c$, as a function of gate voltage $V_G$, respectively. The random component $\Delta I$ (width of hatched area 32) increases with increasing voltage $V_G$.

The generator 1 further comprises two transistors M3, M4, also arranged as a current mirror, with the source and gate of transistor M3 connected to the drain of transistor $M_c$. In this manner, transistor M3 measures the current difference $\Delta I=I_c-I_{ref}$ between the drain currents of transistors $M_c$ and $M_{ref}$. The current $I_2$, at the source of transistor M4, corresponds to the current $\Delta I$ multiplied by a gain $\alpha$, namely $I_2=\alpha*\Delta I$. Transistor M4 is oversized relative to transistor M3, so that the amplification ratio or gain $\alpha$ has a value greater than 1, such as 2, for example.

Figure 5:
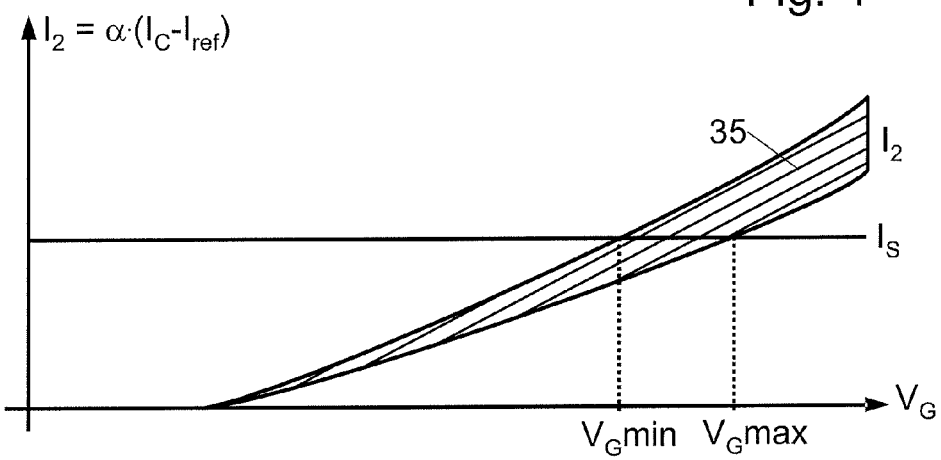
FIG. 5 is a plot of curves of the current variation at another location in the random generator as a function of the voltage applied to the reference and noise source components according to the invention.

FIG. 5 shows how the current $I_2$ varies as a function of the gate voltage $V_G$. Since the current $I_C$ has a random component, the current $I_2$ also has a random component represented by the hatched area 35. The source of transistor M4 is connected to a current source $S_S$ that provides a reference detection current $I_S$ (shown in FIG. 5), so as to obtain at the source of transistor M4 a current equal to $I_2-I_S$. This differential current is input to an inverter gate 2, wherein the output delivers a 0 logic signal when $I_2$ is greater than $I_S$, and delivers a 1 logic signal otherwise.

The logic signal is sampled by a D flip-flop 4 having a D input connected to the output of the inverter gate 2, and having a Q output delivering the random binary signal. The clock input CK of flip-flop 4 is driven by a clock signal Clk having a predetermined frequency. The clock signal Clk is output by an oscillator 3 that may be internal or external to the generator 1.

For the current $I_2$ to oscillate randomly about the current $I_S$, the signal at the Q output of the flip-flop 4 is fed-back to the gate of transistors $M_{ref}$ and $M_c$ through an integrating circuit for automatically adjusting the gate voltage $V_G$. The gate voltage $V_G$ thus ranges between values $V_G$min and $V_G$max, as shown in FIG. 5, which correspond to the width of hatched area 35.

Here, the integrating circuit comprises a PMOS transistor M5 and an NMOS transistor M6. The source of transistor M5 is connected to the drain of transistor M6 through two series-connected current sources S1, S2. The signal provided by output Q of the flip-flop 4 is applied to the gates of both transistors M5 and M6, and the junction node between the current sources S1, S2 is connected to the gates of transistors $M_c$ and $M_{ref}$. The gate of each transistor $M_c$ and $M_{ref}$ is also connected to ground through a capacitor C, which through steady current charging and discharging, adds to the relatively high gate capacitances of transistors $M_{ref}$ and $M_c$ for integrating the gate voltage $V_G$.

Thus, when the signal at the output Q of flip-flop 4 is a 0, transistor M6 is off and transistor M5 is on. Current source S1 then applies a current to the connection node between the gates of transistors $M_{ref}$, $M_c$ and capacitor C. Conversely, if the logic level of the signal applied to the integrating circuit is a 1, transistor M5 is turned off and transistor M6 is on. The current source S2 then applies a current to the connection node between the gates of transistors $M_{ref}$, $M_c$ and capacitor C. Thus, the integrator device continuously tracks current changes within transistor $M_c$ so that the gate voltage $V_G$ is kept in the range $V_G$min to $V_G$max, and bits set to a 1 and a 0 at the generator output have equal probabilities.

Figure 2:
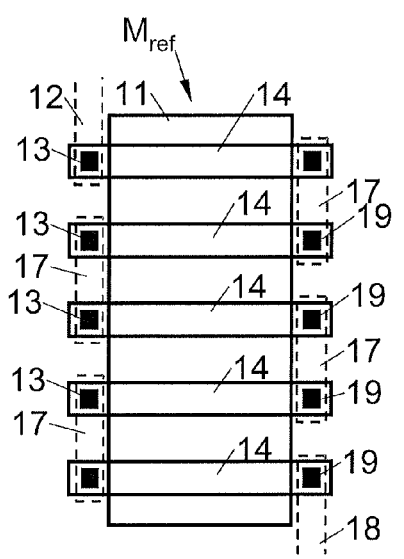
FIG. 2 is a detailed view of transistor $M_{ref}$ within the generator shown in FIG. 1.
Figures 3A, 3B:
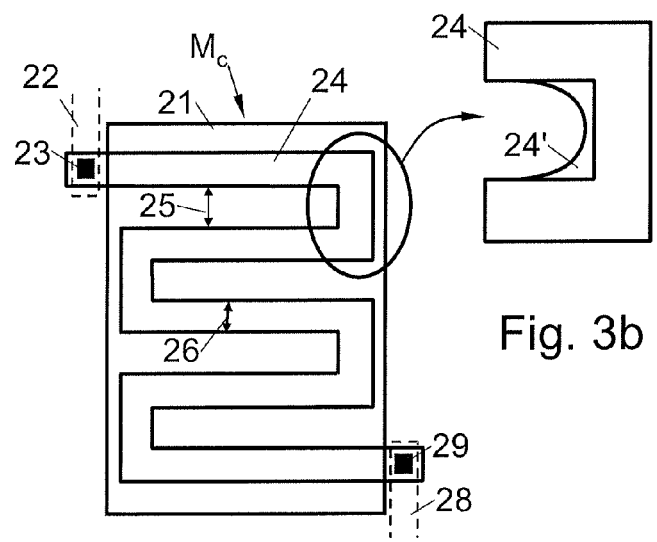

FIGS. 2 and 3a-3b show transistors $M_{ref}$ and $M_c$ in more detail. In FIG. 2, MOS transistor $M_{ref}$ conventionally comprises a plurality of straight and parallel channels. These channels are formed by implanting a dopant into a semiconductor substrate. All of the channels are covered by a gate 11 made of a thin electrically insulating layer, such as, polysilicon (polycrystalline silicon), for example.

The polysilicon layer is coated with a metal contact providing the gate connection. The ends of each channel 14 are provided with contact pads 13, 19 and are series connected by metal contacts 17 shown in broken lines. Two contact pads 13, 19 at the ends of the chain-pattern thus obtained are provided with metal contacts 12, 18, respectively forming the drain and source connectors of the transistor. In other words, transistor $M_{ref}$ is formed by a plurality of series-connected transistors having a common gate.

In FIG. 3a, transistor $M_c$ comprises a channel 24 also formed by implanting a dopant into a semiconductor substrate. The channel is S-shaped or zigzag-shaped, with several portions that are parallel to each other connected through bent portions, substantially the same width as the parallel portions.

Channel 24 as a whole is overlaid with a gate 21 composed of a thin electrically insulating layer, for example, polycrystalline silicon. The insulating layer is overlaid with a metal contact serving as the gate connection. Both ends of the channel include contacts 23, 29 connected to respective metal contacts 22, 28 providing the drain and the source of the transistor, respectively.

The drain-source current includes a random component when the channel dimensions are chosen to be close to the minimum resolution allowed by the manufacturing technology in use. The dimensions may even be slightly less than this minimum because defects may otherwise appear when developing the channel implantation mask. Therefore, as shown in the enlarged view in FIG. 3b, when the channel 24 includes dimensions and a folding step that are close to the limits allowed by the technology in use, or even slightly smaller than these limits, the folded portions obtained include a rounded shape 24' inside the fold. For example, with a 0.35 μm integration technology, the width of parallel 25, 26 and folded portions of the gate is less than 1 μm, and preferably approximately 0.7 μm, whereas the distance between parallel portions is on the order of 1.5 μm.

The random component ΔI of the drain-source current increases as the number of bends in such a transistor increases. On the other hand, if the number of bends increases too much, the drain-source current decreases and has to be amplified with a large gain. Consequently, there is an optimum number of folds, which depends on the integration scale of the component. For example, there were 10 folds in the embodiment tested by the inventors.

The generator 1 may be coupled to a logic circuit 5 as shown in FIG. 1. This is for generating from the bit strings at the output of the flip-flop 4 random numbers having a predetermined bit length (such as 8, 16, 32 bits, etc.). The logic circuit 5 may be a simple series/parallel converter or may include a combiner for combining the bits of the input series signal in a more complex way. The combiner may be designed, for example, to correct possible statistical errors and enhance the randomness of the output generated numbers.

Figure 7:
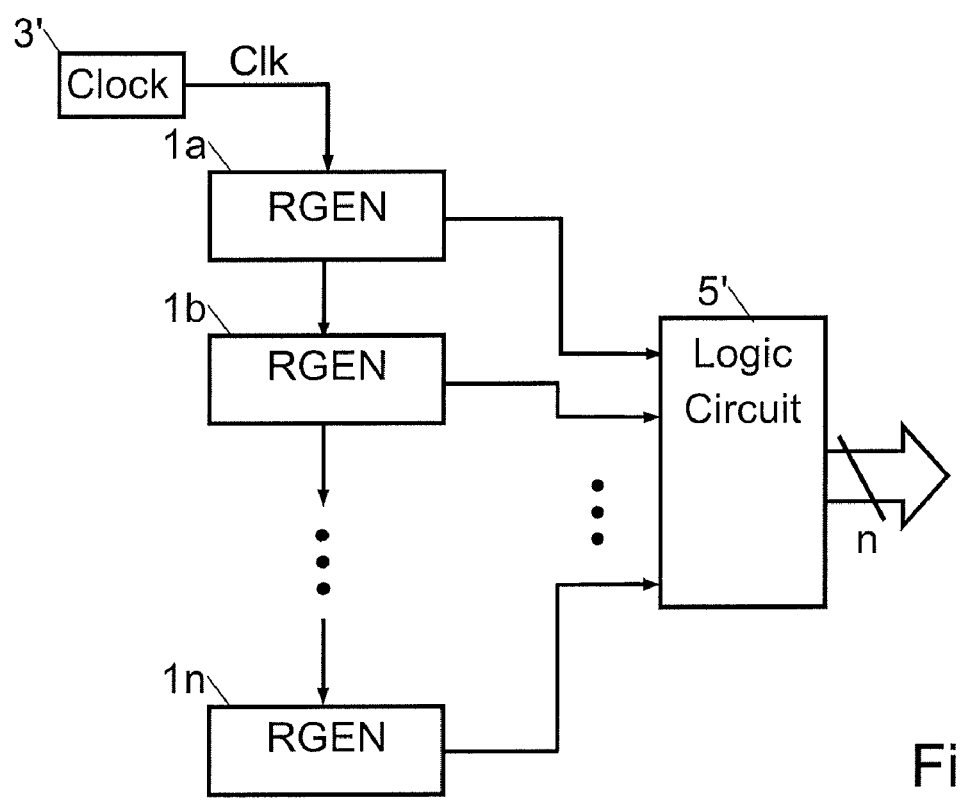
FIG. 7 is a block diagram of a random generator comprising several generators according to the present invention.

Alternatively, as shown in FIG. 7, a plurality of generators 1a, 1b, ... 1n according to the invention may be connected in parallel. Each generator is fed with a clock signal Clk delivered by a common oscillator 3'. Such a generator assembly delivers, at each cycle of clock Clk, a random number whose length n corresponds to the number of parallel-connected generators. The respective outputs of the generators can be combined in a simple or complex way within a logic circuit 5'.

Figure 6:
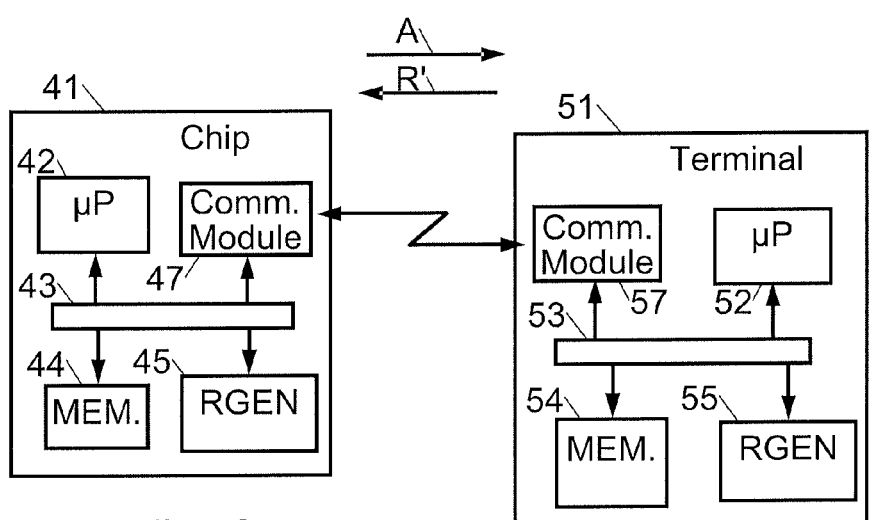
FIG. 6 is a block diagram of an example application of a random signal generator according to the present invention.

The generator illustrated in FIG. 1 or 7 perfectly lends itself to integration within a chip, such as those used in smart cards, of which an example is schematically shown in FIG. 6. The illustrated chip 41 comprises, in a conventional manner, a processor unit 42 such as a microprocessor or microcontroller, a memory 44 of the ROM, RAM and/or EEPROM type, and a communications module 47 for communicating with an external terminal 51. These various units are interconnected through an internal bus 43. The chip 41 also comprises a random generator 45 according to the invention, which includes the above-described generator 1.

The communications module 47, which is of the contact-type or contactless-type, is designed to cooperate with the corresponding communications module 57 provided in terminal 51. The terminal 51 comprises a processor unit 52, a memory 54 and an internal bus 53 allowing the processor unit to communicate with the memory and communications module 57.

The random generator 45 is used in an authentication procedure of terminal 51 as performed by the chip 41 for authorizing a transaction. For this purpose, the processor unit 42 uses generator 45 for generating a random number A, which is transmitted to terminal 51. In parallel, processor unit 42 computes a result $R=F_{KS}(A)$ obtained by transforming the random number A according to an authentication function $F_{KS}$ that uses a secret key KS. Terminal 51, which knows the secret key KS, performs the same computation and transmits the transformation result R' to chip 41. If the chip finds that both results R and R' match, it proceeds to the transaction requested by the terminal 51.

Preferably, terminal 51 also comprises a random generator 55, according to the present invention, for authenticating the chip 41. In this case, the terminal 51 executes a procedure similar to the one described above by sending a random number to the chip 41, and compares the computed result with the result that has been computed and transmitted by the chip.

Those skilled in the art will recognize that the random generator according to the present invention can be subject to many embodiments, modifications and applications within the scope to the above teaching.

That which is claimed is:

1. An electronic device comprising:
   at least one random signal generator circuit configured to generate a random digital number and comprising
      an electronic noise source comprising a folded MOS transistor having a drain-source current with a random component, and
      a logic circuit configured to generate the random digital number based upon the random component;
   a communications module coupled to said at least one random signal generator circuit and configured to transmit the random digital number to an external terminal; and
   a processor coupled to said at least one random signal generator circuit and configured to transform the generated random digital number based upon an authentication function that uses a secret key;
   said processor also configured to compare a result of the authentication function to a result of another authentication function provided by the external terminal in response to the random digital number being sent thereto, and to authorize a transaction with the external terminal if the comparison is a match.

2. An electronic device according to claim 1, wherein said at least one random signal generator circuit, communications module, and processor are configured in an integrated circuit.

3. An electronic device according to claim 2, further comprising a chip card substrate carrying said integrated circuit.

4. An electronic device according to claim 1, wherein said at least one random signal generator circuit comprises a plurality thereof.

5. An electronic device according to claim 1, wherein the electronic device comprises a portable electronic device.

6. An electronic device according to claim 1, wherein said folded MOS transistor comprises a drain and a source with a channel defined therebetween, with the channel being S-shaped and having a size that is at a resolution limit based upon manufacturing technology.

7. An electronic device according to claim 1, wherein said folded MOS transistor comprises a drain and a source with a channel defined therebetween, with the channel being zigzag-shaped and having a size that is at a resolution limit based upon manufacturing technology.

8. An electronic device according to claim 1, further comprising a reference transistor coupled to said folded MOS transistor, said reference transistor configured to receive a gate voltage and a bias current equal to a gate voltage and a bias current applied to said folded MOS transistor for causing the drain-source current therefrom to randomly vary.

9. An electronic device according to claim 8, further comprising a comparison circuit configured to compare the randomly varying drain-source current to a detection current.

10. An electronic device according to claim 9, wherein said comparison circuit is configured to determine a difference between the randomly varying drain-source current and the detection current; and further comprising an amplifier configured to amplify the difference.

11. An electronic device according to claim 1, wherein said logic circuit comprises a sampling circuit configured to sample the digital signal for providing the random digital number.

12. An electronic device according to claim 1, further comprising a circuit configured to maintain a gate voltage on said folded MOS transistor within a desired range of values.

13. An electronic device comprising:
at least one random signal generator circuit configured to generate a random number and comprising
a folded MOS transistor with a random component, and
a logic circuit configured to generate the random number based upon the random component;
a communications module coupled to said at least one random signal generator circuit and configured to transmit the random number to an external terminal; and
a processor coupled to said at least one random signal generator circuit and configured to transform the generated random number based upon an authentication function that uses a secret key;
said processor also configured to compare a result of the authentication function to a result of another authentication function provided by the external terminal in response to the random number being sent thereto.

14. An electronic device according to claim 13, wherein said at least one random signal generator circuit, communications module, and processor are configured in an integrated circuit.

15. An electronic device according to claim 14, further comprising a chip card substrate carrying said integrated circuit.

16. An electronic device according to claim 13, wherein said at least one random signal generator circuit comprises a plurality thereof.

17. An electronic device according to claim 13, wherein said folded MOS transistor comprises a drain and a source with a channel defined therebetween, with the channel being S-shaped and having a size that is at a resolution limit based upon manufacturing technology.

18. An electronic device according to claim 13, wherein said folded MOS transistor comprises a drain and a source with a channel defined therebetween, with the channel being zigzag-shaped and having a size that is at a resolution limit based upon manufacturing technology.

19. An electronic device according to claim 13, further comprising a reference transistor coupled to said folded MOS transistor, said reference transistor configured to receive a gate voltage and a bias current equal to a gate voltage and a bias current applied to said folded MOS transistor for causing a drain-source current therefrom to randomly vary.

20. A method of authorizing a transaction with an external terminal using an electronic device comprising at least one random signal generator circuit configured to generate a random number and comprising a folded MOS transistor with a random component, and a logic circuit configured to generate the random number based upon the random component, the method comprising:
using a communications module coupled to the at least one random signal generator circuit to transmit the random number to the external terminal;
using a processor coupled to the at least one random signal generator circuit to transform the generated random number based upon an authentication function that uses a secret key; and
also using the processor to compare a result of the authentication function to a result of another authentication function provided by the external terminal in response to the random number being sent thereto, and to authorize the transaction with the external terminal if the comparison is a match.

21. A method according to claim 20, wherein the at least one random signal generator circuit, communications module, and processor are configured in an integrated circuit.

22. A method according to claim 21, further comprising a chip card substrate carrying the integrated circuit.

23. A method according to claim 20, wherein the folded MOS transistor comprises a drain and a source with a channel defined therebetween, with the channel being S-shaped and having a size that is at a resolution limit based upon manufacturing technology.

24. A method according to claim 20, wherein the folded MOS transistor comprises a drain and a source with a channel defined therebetween, with the channel being zigzag-shaped and having a size that is at a resolution limit based upon manufacturing technology.

* * * * *